United States Patent
Takamine

(10) Patent No.: US 8,169,278 B2
(45) Date of Patent: May 1, 2012

(54) SURFACE ACOUSTIC WAVE DEVICE AND DUPLEXER

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 98 days.

(21) Appl. No.: 12/796,757

(22) Filed: Jun. 9, 2010

(65) Prior Publication Data

US 2010/0237963 A1 Sep. 23, 2010

Related U.S. Application Data

(63) Continuation of application No. PCT/JP2008/003639, filed on Dec. 8, 2008.

(30) Foreign Application Priority Data

Dec. 11, 2007 (JP) ................................ 2007-319287

(51) Int. Cl.
*H03H 9/72* (2006.01)
*H03H 9/64* (2006.01)

(52) U.S. Cl. ...................... 333/133; 333/195; 310/313 D

(58) Field of Classification Search .................. 333/193, 333/194, 195, 196; 310/313 B, 313 C, 313 D
See application file for complete search history.

(56) References Cited

U.S. PATENT DOCUMENTS

| 2002/0101304 | A1 | 8/2002 | Onishi et al. | |
| 2005/0001699 | A1* | 1/2005 | Takamine | ..................... 333/195 |
| 2006/0192462 | A1 | 8/2006 | Iwamoto et al. | |

FOREIGN PATENT DOCUMENTS

| EP | 1 195 896 A1 | 4/2002 | |
| JP | 3-128519 | * 5/1991 | ..................... 333/195 |
| JP | 2001-298346 A | 10/2001 | |
| JP | 2002-261582 A | 9/2002 | |
| JP | 2002-314365 A | 10/2002 | |
| JP | 2003-037471 A | 2/2003 | |
| JP | 2004-253937 A | 9/2004 | |
| JP | 2004-304722 A | 10/2004 | |
| JP | 2006-217226 A | 8/2006 | |
| WO | 01/82480 A1 | 11/2001 | |
| WO | 2006/006343 A1 | 1/2006 | |

OTHER PUBLICATIONS

Official Communication issued in International Patent Application No. PCT/JP2008/003639, mailed on Feb. 10, 2009.
Official Communication issued in corresponding Korean Patent Application No. 10-2010-7012304, mailed on Aug. 1, 2011.

* cited by examiner

*Primary Examiner* — Barbara Summons
(74) *Attorney, Agent, or Firm* — Keating & Bennett, LLP

(57) ABSTRACT

A surface acoustic wave device in which miniaturization and a flat design implemented, is resistant to a deformation responsive to a pressure of a molten resin in the formation of a mold resin layer, and is less susceptible to a characteristic degradation. In the surface acoustic wave device, an IDT electrode is located on a piezoelectric substrate, and an insulator member is arranged such that a space B surrounding the IDT electrode is provided. For the purpose of reducing the area of the space B, reflectors having weighted portions are arranged on both sides of the IDT electrode. The weighted portions include electrode fingers of the reflectors that become shorter in length as they extend farther away from the IDT electrode. The shape of the space B is reduced accordingly.

9 Claims, 6 Drawing Sheets

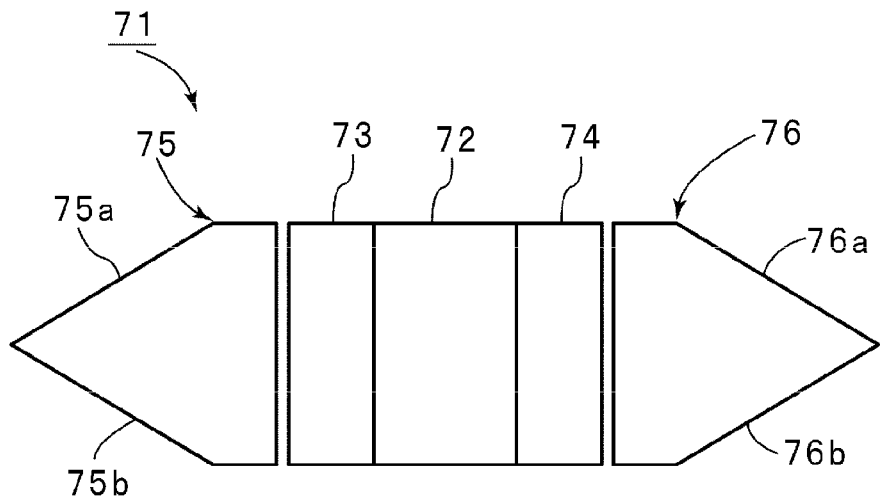
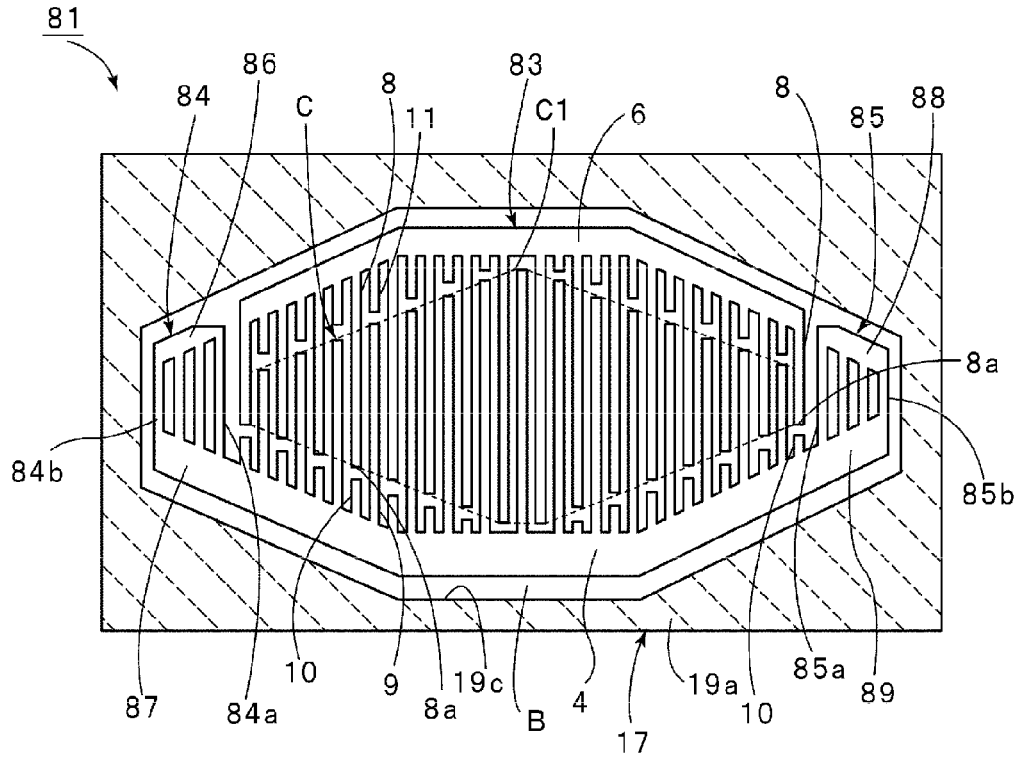

SURFACE ACOUSTIC WAVE DEVICE AND DUPLEXER

BACKGROUND OF THE INVENTION

1. Field of the Invention

The present invention relates to a surface acoustic wave device for use as a resonator or a band-pass filter. More specifically, the present invention relates to a surface acoustic wave device including reflectors arranged in a surface acoustic wave traveling direction on both sides of a region of an IDT electrode, and a duplexer including the surface acoustic wave device.

2. Description of the Related Art

A surface acoustic wave device is widely used as a band-pass filter at an RF stage of a cellular phone.

The surface acoustic wave device includes an IDT electrode on a piezoelectric substrate. A formation region of the IDT electrode is excited with an alternating current applied to the IDT electrode. A space has been arranged in a package of the surface acoustic wave device so as not to impede vibration. This arrangement naturally has caused the surface acoustic wave device to be bulky.

Japanese Unexamined Patent Application Publication No. 2006-217226 described below has proposed a structure that allows this type of surface acoustic wave device to be miniaturized. FIG. 9 is a sectional front view of the surface acoustic wave device described in Japanese Unexamined Patent Application Publication No. 2006-217226. The surface acoustic wave device 501 includes an IDT electrode 503 on a piezoelectric substrate 502. A protective film 504 is formed to cover the IDT electrode 503. A surrounding wall 505 is formed on the piezoelectric substrate 502. The surrounding wall 505 is made of an insulating material, and surrounds a formation region of the IDT electrode 503. A lid 506 is laminated onto the surrounding wall 505. The lid 506 is made of an insulating material, and closes a space A surrounded by the surrounding wall 505. The space A is thus formed such that the vibration of the IDT electrode 503 is not impeded.

Bumps 507 and 508 electrically connected to the IDT electrode 503 or the like are formed on the top surface of the piezoelectric substrate 502. The bumps 507 and 508 penetrate through the surrounding wall 505 and reach through-holes 506a and 506b and then protrude from the top surface of the lid 506.

As illustrated in FIG. 10, the surface acoustic wave device 501 is surface-mounted on a wiring board 510. Electrode lands 511 and 512 are formed on the top surface of the wiring board 510. The surface acoustic wave device 501 is surface-mounted on the wiring board 510 such that the bumps 507 and 508 are connected to the electrode lands 511 and 512.

The space A is defined by the surrounding wall 505 and the lid 506 in the surface acoustic wave device 501 in order to prevent the vibration of the IDT electrode 503 from being impeded. The use of the bumps 507 and 508 penetrating through the surrounding wall 505 and the lid 506 achieves a compact and surface-mountable design, even with the space A included. After being mounted on the wiring board 510, the surface acoustic wave device 501 is covered with a mold resin.

If a gap is present between the lid 506 and the wiring board 510, a mold resin may intrude into the gap. The lid can be deformed by a pressure of the intruding mold resin, and there is a possibility that the space A is collapsed and that the inner surface of the lid 506 touches the IDT electrode 503.

Since the lid 506 is in contact with the wiring board 510 in the surface acoustic wave device 501, there is no gap, and any fault caused by the pressure of the mold resin is unlikely.

If miniaturization and flat design is further implemented, the lid 506 becomes thinner. If the lid 506 is thinner, the presence of the space A tends to cause the lid 506 to deform during the resin molding. There is a possibility that the lid 506 is directly or indirectly in contact with the IDT electrode 503. If the lid 506 is deformed and the inner surface of the lid 506 is in contact with the region of the IDT electrode 503, filter characteristics and resonance characteristics may be degraded.

SUMMARY OF THE INVENTION

Preferred embodiments of the present invention overcome the problems with the above-described related art, and provide a surface acoustic wave device that reliably prevents the lid from touching the IDT electrode or the like even with a miniaturization design being further implemented.

In accordance with a preferred embodiment of the present invention, a surface acoustic wave device includes a piezoelectric substrate, an IDT electrode located on a top surface of the piezoelectric substrate, a reflector arranged along a surface acoustic wave traveling direction on both sides of a portion of the piezoelectric substrate where the IDT electrode is arranged, and an insulator member arranged on the piezoelectric substrate to provide a closed space defined by the IDT electrode and the reflector. The insulator member includes a sidewall surrounding the space and a top wall closing the top of the space. The reflector including a plurality of electrode fingers is weighted such that the lengths of the electrode fingers are successively shorter in a direction extending from an electrode finger at a first end portion of the reflector adjacent to the IDT electrode toward a second end portion of the reflector opposite the first end portion and the sidewall of the insulator member is inclined with respect to the surface acoustic wave traveling direction in the weighted portion of the reflector.

In accordance with a particular aspect of the surface acoustic wave device of a preferred embodiment of the present invention, the surface acoustic wave device further includes a pad electrode provided on the piezoelectric substrate and electrically connected to the IDT electrode, a terminal electrode provided on the top surface of the insulator member, and an electrically conductive member electrically connecting the pad electrode to the terminal electrode. In this case, the surface acoustic wave device can be easily surface-mounted by causing the top surface of the insulator member including the terminal electrode disposed thereon to be in contact with the electrode land of a wiring board.

Preferably, the electrically conductive member is a through-type electrically conductive member penetrating the insulator member. With this arrangement, the surface acoustic wave device is further miniaturized.

In accordance with various preferred embodiments of the present invention, the number of IDT electrodes is not limited to a particular number. In accordance with another aspect of a preferred embodiment of the present invention, the surface acoustic wave device is a longitudinally coupled resonator-type surface acoustic wave filter including as the IDT electrodes at least three IDT electrodes arranged in the surface acoustic traveling direction.

In accordance with yet another aspect of a preferred embodiment of the present invention, the surface acoustic wave device includes a single IDT electrode as the IDT electrode. The IDT electrode includes first and second bus bars, a plurality of first electrode fingers extending from the inner side of the first bus bar toward the second bus bar, and a plurality of second electrode fingers extending from the inner side of the second bus bar toward the first bus bar. The IDT electrode is apodization weighted. An external side of at least one of the first and second bus bars includes a portion inclined with respect to the surface acoustic wave traveling direction in accordance with apodization weighting, and the insulator member includes the sidewall extending in parallel or substantially in parallel with the inclined external side.

In accordance with yet another aspect of a preferred embodiment of the present invention, the IDT electrode further includes a first dummy electrode facing an end of the first electrode finger with a gap arranged therebetween, the first dummy electrode connected to the second bus bar, and a second dummy electrode facing an end of the second electrode finger with a gap arranged therebetween, the second dummy electrode connected to the first bus bar. The IDT electrode is apodization weighted to have an apodization weighted portion, where an apodization decreases in the surface acoustic wave traveling direction away from a maximum apodization portion of electrode finger apodization in the IDT electrode. A side where the first electrode finger of the first bus bar is connected to the second dummy electrode includes a portion inclined with respect to the surface acoustic wave traveling direction such that the side is spaced away by a constant separation from an envelope line of the apodization weighting. A side where the second electrode finger of the second bus bar is connected to the first dummy electrode includes a portion inclined with respect to the surface acoustic wave traveling direction such that the side is spaced away by a constant separation from an envelope line of the apodization weighting. In a portion where the outermost electrode finger of the IDT electrode is adjacent to the reflector, the length of the electrode finger of the reflector is approximately equal to a sum of the length of the electrode finger of the IDT electrode and the length of the dummy electrode facing the end of the electrode finger of the IDT electrode. With this arrangement, an area of a region excluding an electrode finger apodization region in the IDT electrode is reduced. The area of the closed space is even more reduced.

The surface acoustic wave device according to various preferred embodiments of the present invention may include a variety of circuit structures. In accordance with yet another aspect of a preferred embodiment of the present invention, a surface acoustic wave device may include a ladder-type filter including a series arm resonator and a parallel arm resonator, the series arm resonator including the surface acoustic wave device according to a preferred embodiment of the present invention, and the parallel arm resonator including the surface acoustic wave device according to a preferred embodiment of the present invention. The ladder-type filter thus provided features a miniaturized design and is reliable and more insusceptible to characteristic degradation caused by a deformation of the insulator member.

In accordance with a preferred embodiment of the present invention, the insulator member may be constructed in a variety of designs. In accordance with still another particular aspect of a preferred embodiment of the present invention, the insulator member is disposed on the piezoelectric substrate and includes a support layer having an aperture through which a region of the IDT electrode and the reflector is exposed, and a cover laminated onto the support layer to close the aperture of the support layer. With this arrangement, the insulator member is easily formed by simply laminating the cover onto the support layer after the formation of the support layer.

The surface acoustic wave device according to various preferred embodiments of the present invention is used in a variety of communication apparatuses. In accordance with yet another particular aspect of a preferred embodiment of the present invention, a duplexer is provided. The duplexer includes a transmitter side filter including a ladder-type filter circuit, a receiver side filter including the surface acoustic wave device according to a preferred embodiment of the present invention, a wiring board including the transmitter side filter and the receiver side filter mounted thereon, and a mold resin layer encapsulating the transmitter side filter and the receiver side filter mounted on the wiring board.

Since the reflector is weighted in the surface acoustic wave device according to a preferred embodiment of the present invention as described above, the area of the space enclosed and defined by the IDT electrode and the reflector is reduced. Even if the miniaturization and flat design is promoted in the surface acoustic wave device, the insulator member above the closed space is insusceptible to deformation. For example, the insulator member is insusceptible to deformation during a resin mold formation, and the insulator member is unlikely to touch a region where the IDT electrode and the reflector are arranged. The surface acoustic wave device is free from characteristic degradation and the reliability of the surface acoustic wave device is thus increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1A is a diagrammatic sectional plan view illustrating a major portion of the surface acoustic wave device with a cover thereof removed, and FIG. 1B is a diagrammatic sectional front view of the surface acoustic wave device.

FIG. 6 is a diagrammatic plan view illustrating another modification of weighting in the reflector of the surface acoustic wave device according to a preferred embodiment of the present invention.

FIG. 7 is a diagrammatic sectional plan view illustrating an electrode structure of a surface acoustic wave device in accordance with a third preferred embodiment of the present invention.

DETAILED DESCRIPTION OF THE PREFERRED EMBODIMENTS

Figure 1A:
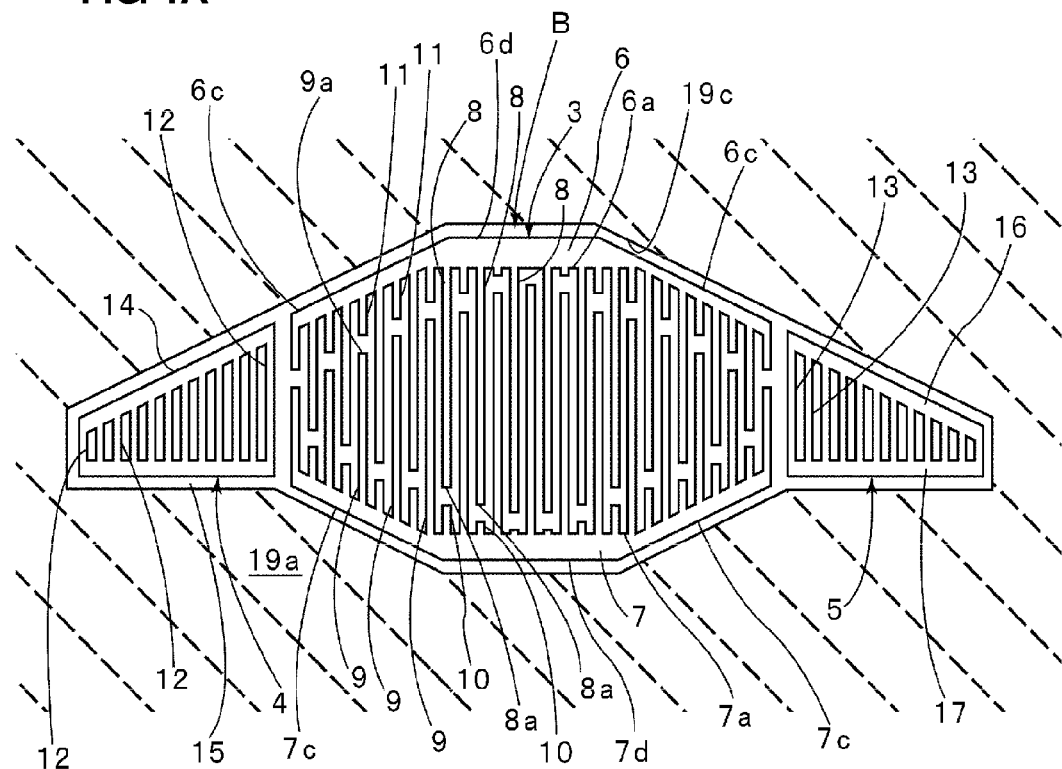
FIGS. 1A and 1B illustrate a surface acoustic wave device of a first preferred embodiment of the present invention.
Figure 1B:
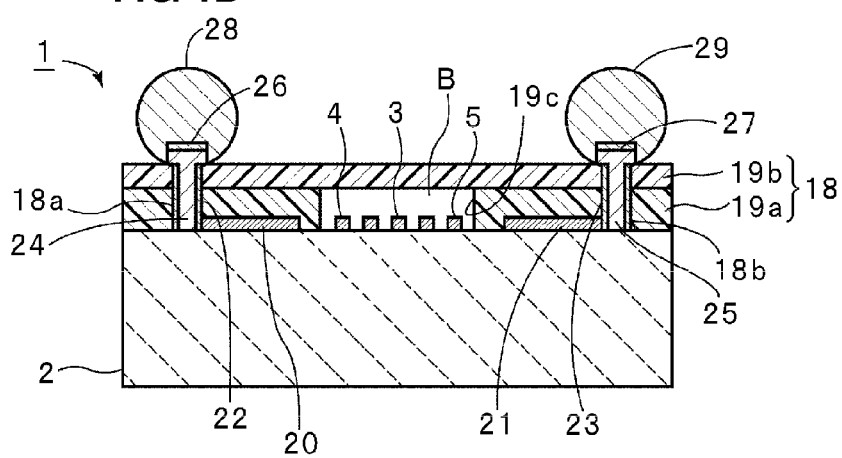

FIGS. 1A and 1B are a partially cutaway diagrammatic plan view and a diagrammatic sectional front view, each illustrating a major portion of a surface acoustic wave device in accordance with a first preferred embodiment of the present invention. FIG. 1A diagrammatically illustrates in enlargement a region of a space B in the surface acoustic wave device with a cover 19b of the insulator member 18 of FIG. 1B to be discussed later removed.

The surface acoustic wave device 1 includes a piezoelectric substrate 2. The piezoelectric substrate 2 is made of appropriate piezoelectric monocrystal or piezoelectric ceramic.

An electrode structure illustrated in FIG. 1A is provided on the top surface of the piezoelectric substrate 2. The electrode structure includes an IDT electrode 3, and reflectors 4 and 5 arranged on both sides of the IDT electrode 3 along the surface acoustic wave traveling direction of the IDT electrode 3. FIG. 1B diagrammatically illustrates a region where the IDT electrode 3 and the reflectors 4 and 5 are provided.

Referring to FIG. 1A, the IDT electrode 3 includes first and second bus bars 6 and 7 mutually opposed to each other. A plurality of first electrode fingers 8 are connected to the first bus bar 6. The first electrode fingers 8 extend toward the second bus bar 7. A plurality of second electrode fingers 9 are connected to the second bus bar 7. The second electrode fingers extend toward the first bus bar 6. The first and second electrode fingers 8 and 9 extend mutually in parallel or substantially in parallel to each other, and mutually interdigitally arranged. A direction perpendicular or substantially perpendicular to the direction of extension of the first and second electrode fingers 8 and 9 and in parallel or substantially in parallel with the top surface of the piezoelectric substrate 2 is the surface acoustic wave traveling direction.

A first dummy electrode 10 is arranged to face from the outside an end 8a of the first electrode finger 8 with a gap arranged therebetween. The first dummy electrodes 10 are connected to inner sides 7a of the second bus bar 7. Similarly, a second electrode finger 11 is arranged to face from the outside an end 9a of the piezoelectric substrate 2. The second electrode fingers 11 are connected to inner sides 6a of the surface acoustic wave device 1.

In accordance with the present preferred embodiment, the IDT electrode 3 is apodization weighted. Apodization weighting is weighting performed on the first and second electrode fingers 8 and 9 such that a width of the first electrode finger 8 overlapping in the surface acoustic wave traveling direction the second electrode finger 9 connected to a voltage different from that of the first electrode finger 8, i.e., apodization width varies in the surface acoustic wave traveling direction. Referring to FIG. 1A, the apodization weighting is set such that the apodization width is successively reduced from the center of the IDT electrode 3 to the end of the IDT electrode 3 in the surface acoustic wave traveling direction.

The inner side 6a of the first bus bar 6 and the inner side 7a of the second bus bar 7 are spaced apart from the envelope line formed by the apodization weighting by a predetermined separation. The outer side of each of the first and second bus bars 6 and 7 is also spaced apart in parallel or substantially in parallel from the envelope line by a predetermined separation.

The outer sides of the first and second bus bars 6 and 7 include portions 6c and 7c inclined with respect to the surface acoustic wave traveling direction. In the center of the IDT electrode 3 in the surface acoustic wave traveling direction, the outer sides of the first and second bus bars 6 and 7 include straight portions 6d and 7d linearly extending in the surface acoustic wave traveling direction.

On the other hand, the reflectors 4 and 5 include pluralities of electrode fingers 12 and 13. In the reflector 4, the plurality of electrode fingers 12 become successively shorter along a direction extending away from the electrode finger arranged to the side of the IDT electrode 3 to the electrode finger on the side opposite the IDT electrode 3. Similarly in the reflector 5, the plurality of electrode fingers 13 become successively shorter along a direction extending away from the electrode finger arranged to the side of the IDT electrode 3 to the electrode finger on the side opposite the IDT electrode 3.

In the reflectors 4 and 5, the ends of the pluralities of electrode fingers 12 and 13 are connected together by bus bars 14, 15, 16, and 17. The bus bars 15 and 17 extend in the surface acoustic wave traveling direction and the other bus bars 14 and 15 are inclined with reference to the surface acoustic wave traveling direction in accordance with the change of the lengths of the electrode fingers 12 and 13. In this case, the outer sides of the bus bars 14 and 16 are also inclined in the same manner as the inner sides of the bus bars 14 and 16.

The electrode structure illustrated in FIG. 1A is housed in the space B illustrated in FIG. 1B. FIG. 1B diagrammatically illustrates the electrode structure within the space B. The insulator member 18 is laminated on the piezoelectric substrate 2 to define the space B. In accordance with the present preferred embodiment, the insulator member 18 includes a support layer 19a, and a cover 19b laminated on the support layer 19a. Each of the support layer 19a and the cover 19b is made of an insulating material. The insulating material may be an inorganic material such as $SiO_2$, $SiN$, or $Al_2O_3$, or a synthetic resin such as an epoxy resin, a silicone resin, or a polyimide resin.

The material of the support layer 19a may or may not be the same as the material of the cover 19b.

Pad electrodes 20 and 21 are provided on the piezoelectric substrate 2. The pad electrodes 20 and 21 are electrically connected to the first bus bar 6 and the second bus bar 7 at unillustrated locations. The pad electrodes 20 and 21 and the above-described the IDT electrode 3 are made of any appropriate metal such as Ag, Cu, Pt, or an alloy thereof.

In accordance with the present preferred embodiment, through-holes 18a and 18b are formed in the insulator member 18 including the support layer 19a and the cover 19b. Electrically conductive layers 22 and 23 are arranged to cover the inner wall of the through-hole 19a and 19b and is electrically connected to the pad electrodes 20 and 21. Through-type conductors 24 and 25 fill the through-holes plated with the conductive layers 22 and 23. Under-bump metal layers 26 and 27 are provided on top of the through-type conductors 24 and 25. The through-type conductors 24 and 25 protrude above the top surface of the cover 19b. Bumps 28 and 29 are provided on the under-bump metal layers 26 and 27.

The conductive layers 22 and 23, the through-type conductors 24 and 25, and the under-bump metal layers 26 and 27 are made of an appropriate metal or an alloy, such as Ag, Ag—Pd alloy, or Cu. The bumps 28 and 29 are made of an appropriate electrically conductive material such as solder or Au, for example.

Figure 10:
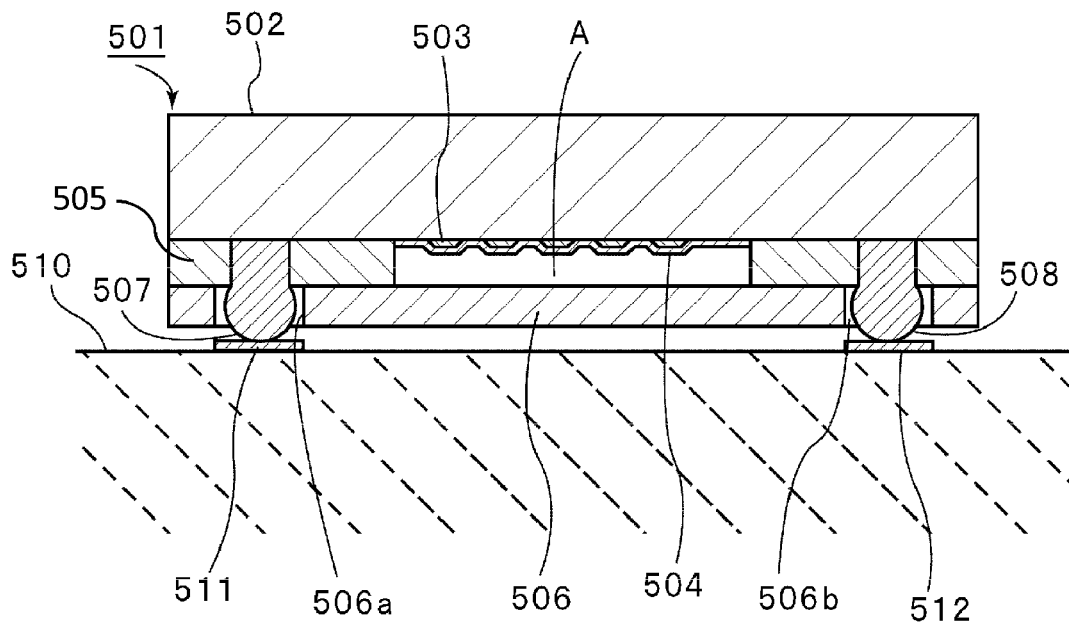
FIG. 10 is a sectional front view illustrating a structural problem of the known surface acoustic wave device of FIG. 9 mounted on a wiring board.

Since the bumps 28 and 29 are provided on the top surface of the insulator member 19 in the present preferred embodiment, the state of FIG. 1B is upside-down inverted such that the surface acoustic wave device 1 is surface-mounted on a wiring board. More specifically, the bumps 28 and 29 may be bonded to the electrode lands formed on the wiring board 510 illustrated in FIG. 10 to mount the surface acoustic wave device 1. In this case, a mold resin such as an epoxy resin is typically molded around the mounted surface acoustic wave device 1 in order to increase humidity resistance.

In accordance with the present preferred embodiment, the flat configuration illustrated in FIG. 1A causes the cover 19b to be resistant to deformation under the pressure of the mold resin. More specifically, the insulator member 18 is insusceptible to deformation. This arrangement makes it less likely that the inner surface of the insulator member 18, more specifically, the inner surface of the cover 19b touches the electrode finger 13. Characteristic degradation is thus controlled.

As illustrated in FIG. 1A, the space B in plan view is not rectangular. In the region where the reflectors 4 and 5 are arranged, the width of the reflectors 4 and 5 vary in the surface acoustic wave traveling direction such that the area of the space B is reduced. In accordance with the present preferred embodiment, the space B is set to be smaller in area in not only the region where the reflectors 4 and 5 are arranged, but also in the region where the IDT electrode 3 is arranged. The cover 19b is thus even more insusceptible to deformation.

The space B is surrounded by the sidewall 19c of the support layer 19a defining the insulator member 18. The sidewall 19c is arranged to be spaced apart from the outer sides of the first and second bus bars 6 and 7 of the IDT electrode 3 by a predetermined separation. A portion of the sidewall 19c spaced apart from the inclined portions 6c and 7c of the first and second bus bars 6 and 7 by a predetermined separation is also inclined with respect to the surface acoustic wave traveling direction. The bus bars 14 and 16 of the reflectors 4 and 5 are also inclined with respect to the surface acoustic wave traveling direction. The space B is small in area in comparison with a structure in which a rectangular IDT electrode and a rectangular reflector are arranged.

Figure 2:
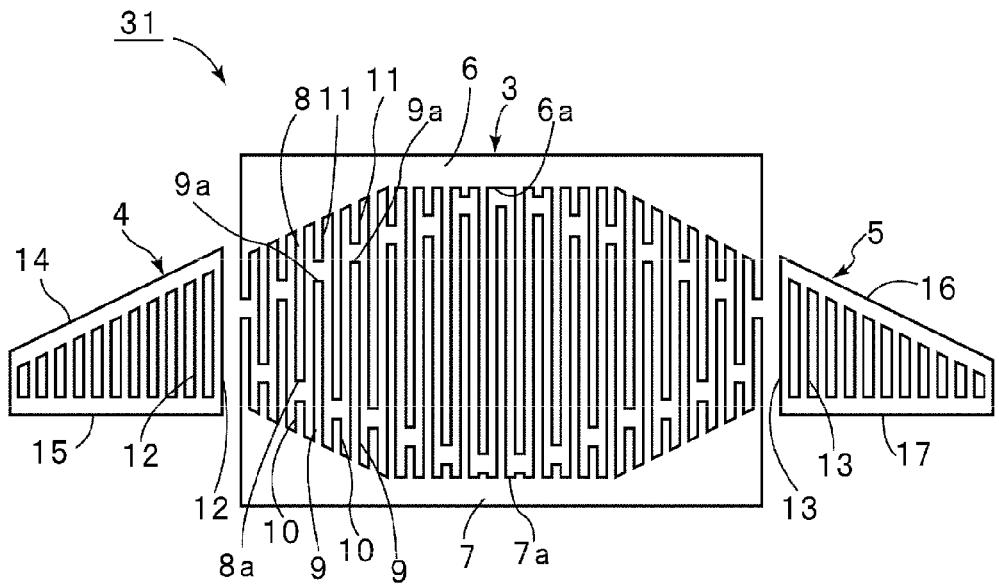
FIG. 2 is a diagrammatic sectional plan view illustrating a major portion of a modification of the surface acoustic wave device illustrated in FIGS. 1A and 1B.

FIG. 2 is a diagrammatic plan view illustrating an electrode structure of a modification of the surface acoustic wave device 1 of the above-described preferred embodiment. The reflectors 4 and 5 in the surface acoustic wave device 31 of the present preferred embodiment are structured in the same fashion as in the above-described preferred embodiment. The IDT electrode 3 is not provided with the inclined portions 6c and 7c in the outer sides of the first and second bus bars 6 and 7. The outline of the IDT electrode 3 preferably is rectangular in shape. The area of a space surrounding the electrode structure is slightly larger than that in the above-described preferred embodiment. In accordance with the present preferred embodiment, as well, the area of the closed space is small in comparison with a rectangular reflector, i.e., a reflector including all the electrode fingers having the same length as the electrode finger next to the region of the IDT electrode 3. By reducing the area of the closed space in the same manner as the preferred embodiment described above, the insulator member is prevented from being deformed.

Figure 3A:
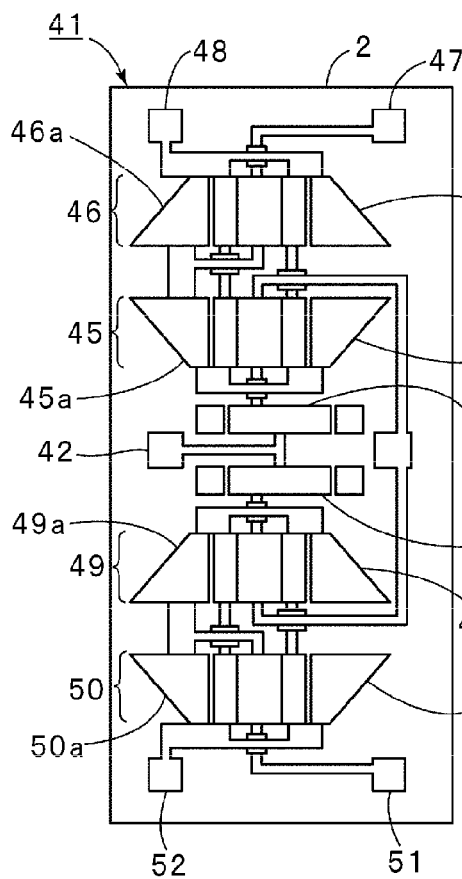
FIG. 3A is a diagrammatic sectional plan view illustrating an electrode structure of a surface acoustic wave device in accordance with a second preferred embodiment.
Figure 3B:
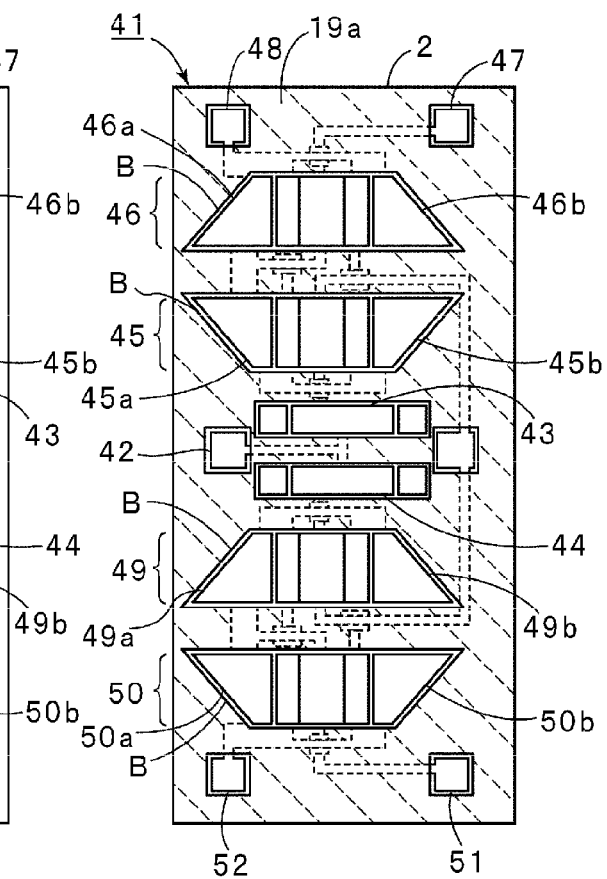
FIG. 3B is a diagrammatic sectional plan view illustrating the surface acoustic wave device with a cover thereof removed.

FIGS. 3A and 3B are plan views illustrating a longitudinally coupled resonator-type surface acoustic wave filter device having a balanced-unbalanced conversion function in accordance with a second preferred embodiment. FIG. 3A is the plan view illustrating the filter device before an insulator member is formed, and FIG. 3B is the diagrammatic plan view illustrating the filter device with a cover of the insulator member removed.

A surface acoustic wave filter device 41 includes the piezoelectric substrate 2. An input side pad electrode 42 is provided on the piezoelectric substrate 2. One-port type surface acoustic wave resonators 43 and 44 are arranged to be electrically connected to the input side pad electrode 42. Each of the one-port type surface acoustic wave resonators 43 and 44 includes one IDT electrode and reflectors arranged on both sides of the IDT electrode. FIGS. 3A and 3B diagrammatically illustrate only the outline of the IDT electrode and the reflectors with the electrode fingers thereof unillustrated.

Two stages of first and second surface acoustic wave filters 44 and 46, each as the surface acoustic wave device of a preferred embodiment of the present invention, are longitudinally connected to the surface acoustic wave resonator 43. Each of the first and second surface acoustic wave filters 44 and 46 is a longitudinally coupled resonator-type 3-IDT surface acoustic wave filter, including three IDT electrodes arranged in the surface acoustic wave traveling direction and reflectors 45a and 45b, and 46a and 46b arranged on both sides of the IDT electrodes. Only the formation location of each IDT electrode is diagrammatically represented by a rectangle. The center IDT electrode serving as an output terminal of the second surface acoustic wave filter 46 is electrically connected to an output side pad electrode 47 defining a first balanced terminal.

Both ends of the center IDT electrode of the second surface acoustic wave filter 46 are electrically connected to a pad electrode 48 connected to ground voltage. Reflectors 45a, 45b, 46a, and 46b are also connected to the ground voltage. Similarly, third and fourth longitudinally coupled resonator-type surface acoustic filters 49 and 50 are longitudinally connected in a two-stage configuration to the backend stage of a surface acoustic wave resonator 44. The surface acoustic filters 49 and are constructed in the same manner as the first and second surface acoustic wave filters 44 and 46. However, it is noted that the surface acoustic filters 49 and 50 are adjusted in IDT phase such that a signal appearing at the output terminals of the fourth surface acoustic wave 50 is different in phase by 180° from a signal appearing at the output terminals of the second surface acoustic wave filter 46.

An output end of the fourth surface acoustic wave 50 defining one end of the center IDT electrode is electrically connected to a pad electrode 51 serving as a second balanced terminal. IDTs on both sides of the center IDT of the fourth surface acoustic wave 50 and reflectors 50a and 50b are electrically connected to a pad electrode 52 connected to the ground voltage.

In accordance with the present preferred embodiment, the reflectors 46a, 46b-50a, and 50b are weighted in the 3-IDT type surface acoustic wave filters 45, 46, 49, and 50 in the same manner as in the first preferred embodiment. In other words, each of the reflectors 45a, 45b, 46a, 46b, 49a, 49b, 50a, and 50b thus includes the longest electrode finger in the end portion thereof next to the region of the IDT electrode and a shorter electrode finger in the opposite end portion, namely, outward in the surface acoustic wave traveling direction.

Referring to FIG. 3B, the area of the space B is reduced in the formation of the insulator member 19 for the insulator member. It is noted that an unillustrated cover is formed of an insulating material on the support layer 19a as illustrated in FIG. 3B to close the space B.

Figure 4A:
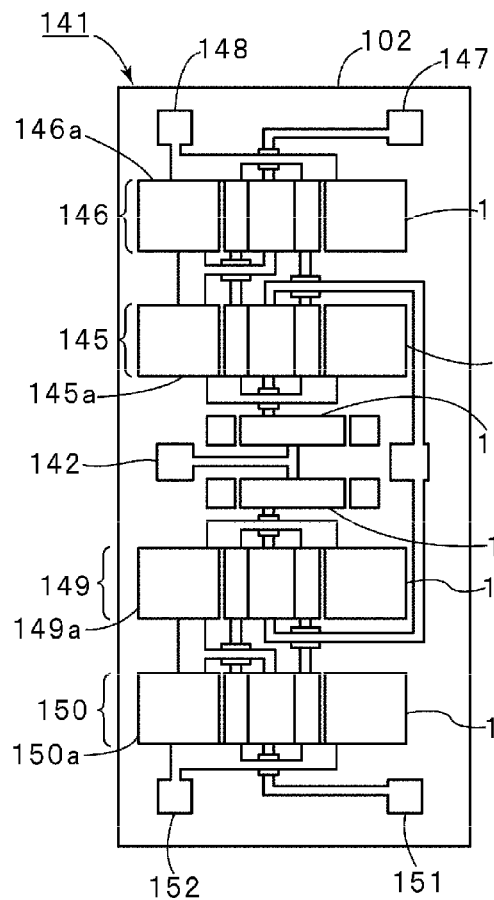
FIG. 4A is a plan view illustrating an electrode structure of a surface acoustic wave device prepared for comparison.
Figure 4B:
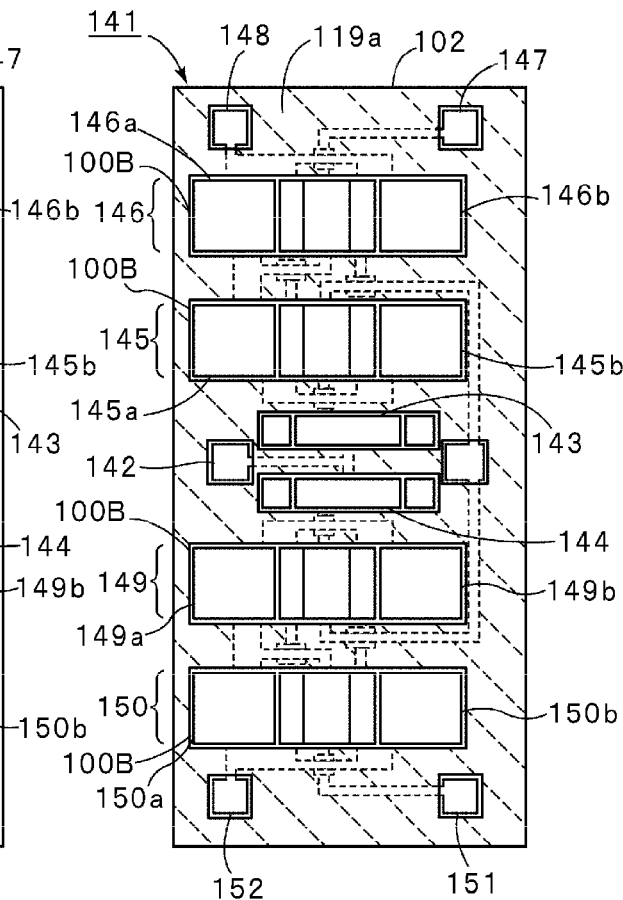
FIG. 4B is a diagrammatic sectional plan view of the surface acoustic wave device with a cover thereof removed.

For comparison, FIGS. 4A and 4B illustrate a surface acoustic wave filter device identical to the surface acoustic wave filter device described above, except that reflectors are not weighted, i.e., all the electrode fingers of the reflector are set to be equal in length to the electrode finger in the end portion to the side of the IDT electrode. FIG. 4A is a plan view illustrating the surface acoustic wave filter device in a state prior to the formation of the insulator member, and FIG. 4B is a diagrammatic sectional plan view illustrating the surface acoustic wave filter device with the support layer 119a of the insulator member formed.

In FIGS. 4A and 4B, elements identical to those illustrated in FIGS. 3A and 3B have reference numerals with 100 respectively added to the corresponding reference numerals, and the discussion thereof is omitted here.

By comparison of FIGS. 3A, 3B with FIG. 4A, 4B, the space B illustrated in FIG. 3B can be set to be smaller than a space 100B illustrated in FIG. 4B. Even if resin molding is performed subsequent to the mounting of the surface acoustic wave filter device to the wiring board or the like, cover deformation is unlikely to take place because of a small area of the space B. Characteristic degradation caused by a deformation of the insulator member 18 including the cover is also unlikely to take place.

The surface acoustic wave filter device illustrated in FIGS. 3A and 3B can be appropriately used for a receiver side filter of a diplexer for use in a cellular phone. In such a case, the receiver side filter including the above-described surface acoustic wave filter device and a transmitter side filter including a known ladder-type filter are mounted on a wiring board to form a duplexer. A resin is molded around the transmitter side filter and the receiver side filter. Since the receiver side filter is the surface acoustic wave device according to a preferred embodiment of the present invention, characteristic degradation caused by a pressure of molten resin is unlikely during the resin molding.

The weighting formation of the reflector is not limited to the formation illustrated in FIGS. 1A-3B. For example, a surface acoustic wave device 61 illustrated in FIG. 5 includes an IDT electrode 62 at the center, and second and third IDT electrodes 63 and 64 on both sides of the IDT electrode 62 in the surface acoustic wave traveling direction. Reflectors 65 and 66 are arranged on both sides of a region where the IDT electrodes 63, 62, and 64 are arranged. The reflector 65 preferably is weighted such that the electrode finger of the reflector 65 in the end portion thereof opposite the IDT electrode 63 is short in length in comparison with the electrode finger in the end portion thereof to the side of the IDT electrode 63. One bus bar 65a of the reflector 65 includes a straight portion 65b and an inclined portion 65c for weighting. More specifically, the bus bar 65a in the upper portion of FIG. 5 has the inclined portion 65c in accordance with the weighting.

Figure 5:
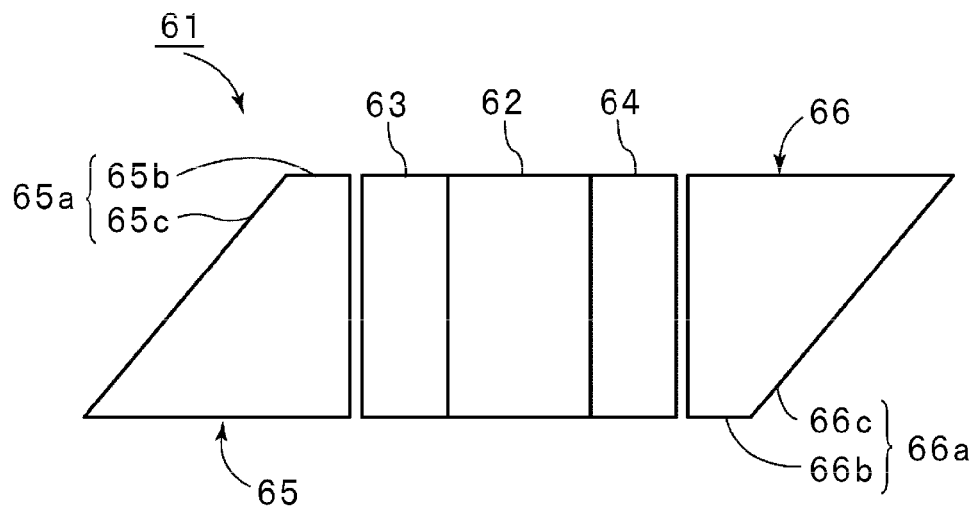
FIG. 5 is a diagrammatic plan view illustrating a modification of weighting in a reflector of the surface acoustic wave device according to a preferred embodiment of the present invention.

In contrast, the bus bar 66a of the reflector 66 in the lower portion of FIG. 5 includes an inclined portion 66c for weighting and a straight portion 66b.

A surface acoustic wave device 71 as a modification illustrated in FIG. 6 includes reflectors 75 and 76 on both sides of a region having IDT electrodes 72-74 in the surface acoustic wave traveling direction. The reflectors 75 and 76 are weighted such that upper and lower bus bars are symmetrical to each other with respect a center line extending along the surface acoustic wave traveling direction. More specifically, first bus bars 75a and 76a and second bus bars 75b and 76b of the reflectors 75 and 76 are arranged to be symmetrical to each other with respect to the center line for weighting. The weighting configuration of the reflectors is not limited to any particular configuration as long as the weighting is performed such that the electrode fingers become successively shorter in a direction from the IDT electrode to the end portion of the reflector opposite the IDT electrode. As illustrated in FIG. 5, the reflector 65 may partially have the electrode fingers remaining constant in length in the straight portion 65b and the electrode fingers becoming shorter in length in the inclined portion 65c as it is outward.

Figure 8:
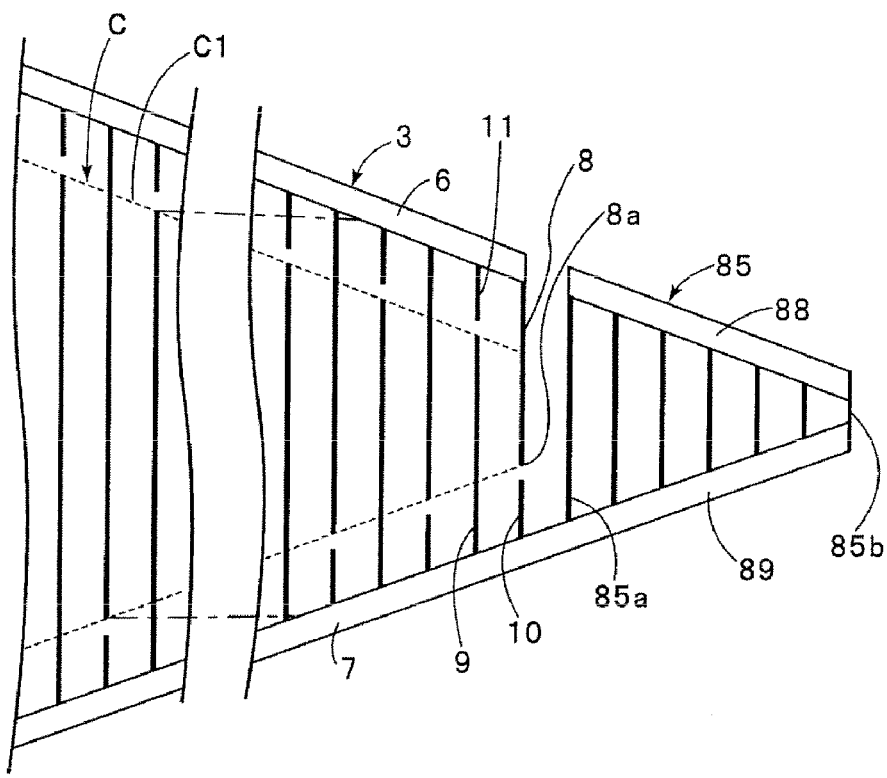
FIG. 8 is a diagrammatic plan view illustrating in enlargement a major portion of the surface acoustic wave device of FIG. 7.
Figure 9:
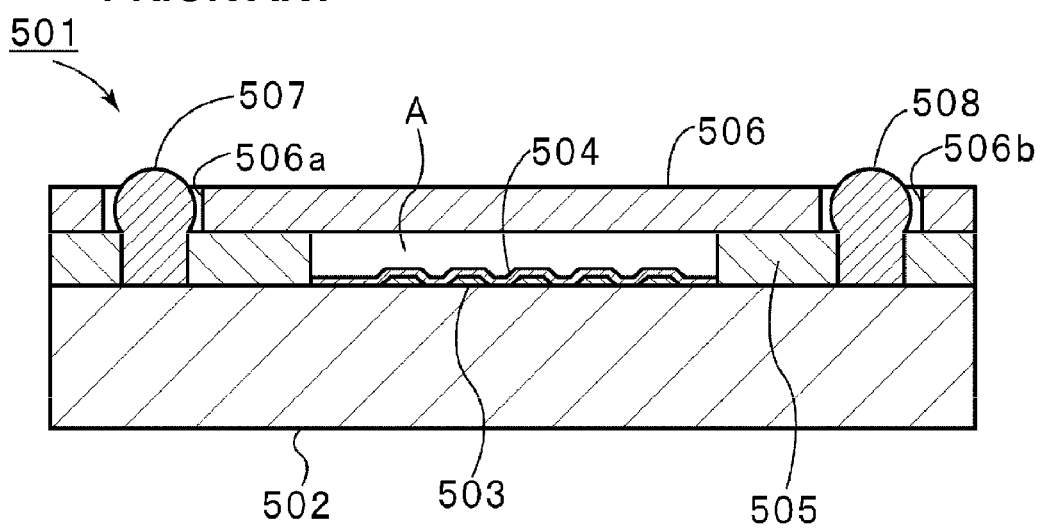
FIG. 9 is a sectional front view illustrating one example of known surface acoustic wave device.

FIG. 7 is a diagrammatic plan view of a surface acoustic wave device of a third preferred embodiment of the present invention. FIG. 8 is a partially cutaway plan view of a major portion of the surface acoustic wave device. FIG. 7 illustrates in a diagrammatic sectional plan view a main portion of a surface acoustic wave device 81 with a cover of an insulator member removed.

The surface acoustic wave device 81 includes an IDT electrode 83, and reflectors 84 and 85 provided on a piezoelectric substrate. The reflectors 84 and 85 are weighted such that the electrode fingers become shorter in a direction from electrode fingers 84a and 85a in end portions thereof next to the IDT electrode 83 to electrode fingers 84b and 85b on the opposite end portion thereof. Outer sides of first and second bus bars 86, 87, 88, and 89 of the reflectors 84 and 85 are inclined for weighting. The inclined side refers to a direction inclined with respect to the surface acoustic wave traveling direction.

In accordance with the present preferred embodiment, the sidewall 19c of the support layer 19a forming the insulator member 18 is inclined in the shape of the space B in plan view in the region including the reflectors 84 and 85. The area of the space B is thus small.

In addition, the area of the space B is also small in the region having the IDT electrode 83. This is because the IDT electrode 83 is apodization weighted such that the apodization width is smaller as it located farther outward from the center of the IDT electrode 83 in the surface acoustic wave traveling direction. The same elements identical to those in FIGS. 1A and 1B are designated with the same reference numerals and the detailed discussion of the IDT electrode 83 is omitted here.

In accordance with the present preferred embodiment, the sidewall 19c of the support layer 19a is inclined in the region including the IDT electrode 83, and the area of the space B is thus small. As in the first preferred embodiment, the insulator member is unlikely to deform even under a pressure applied in the mold resin layer formation.

Moreover in accordance with the present preferred embodiment as illustrated in FIG. 8, in a region where the outermost electrode finger of the IDT electrode 83 is adjacent to the electrode finger 85a of the reflector 85 next to the end portion of the IDT electrode, the length of the electrode finger of the reflector 85 is approximately equal to a sum of the length of the electrode finger of the IDT electrode 83 and the length of the first dummy electrode 10 facing an end 8a of the first electrode finger 8 of the IDT electrode 83.

In accordance with the present preferred embodiment, the inner sides of the first and second bus bars have the inclined portions running substantially in parallel with an envelope line portion C1 closer to the inner side of an apodization weighted envelope line C. Spurious signals in a harmonic higher order mode are thus controlled. A surface acoustic wave device having excellent characteristics is thus provided.

FIGS. 1A and 1B illustrate the surface acoustic wave device having one IDT electrode while FIGS. 3A and 3B illustrate the balanced-unbalanced conversion type surface acoustic wave filter device including a plurality of longitudinally coupled resonator-type surface acoustic wave devices. The present invention is not limited to the surface acoustic wave devices having these structures. More specifically, the present invention may be applicable to a parallel-coupled resonator-type surface acoustic wave filter device.

The present invention may be applicable to a ladder-type filter that employs the surface acoustic wave device of FIGS. 1A and 1B as a surface acoustic wave resonator. As is known, the ladder-type filter includes series arm resonators $S_1$, $S_2$, ... $S_n$ inserted in series arms and parallel arm resonators $P_1, P_2, \ldots, P_n$ inserted in parallel arms and connected between series arms and the ground voltage. Here, n is a natural number. The surface acoustic wave device according to various preferred embodiments of the present invention is used for each of the series arm resonator and the parallel arm resonator to form the ladder-type filter. In such a case, the ladder-type filter is resistant to deformation caused by a pressure in the mold resin layer formation. The ladder-type filter has thus reliable characteristics.

A transmitter side filter and a receiver side filter may be mounted on a wiring board to define a duplexer. The transmitter side filter includes the above-described ladder-type filter, and the receiver side filter includes the longitudinally coupled resonator-type filter illustrated in FIGS. 3A and 3B.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device, comprising:
a piezoelectric substrate;
an IDT electrode provided on a top surface of the piezoelectric substrate;
a reflector arranged along a surface acoustic wave traveling direction on both sides of a portion of the piezoelectric substrate where the IDT electrode is arranged; and
an insulator member arranged on the piezoelectric substrate to provide a closed space defined by the IDT electrode and the reflector, the insulator member including a sidewall surrounding the space and a top wall closing the top of the space; wherein
the reflector including a plurality of electrode fingers is weighted such that lengths of the electrode fingers are successively shorter in a direction extending from an electrode finger at a first end portion of the reflector adjacent to the IDT electrode toward a second end portion of the reflector opposite the first end portion, and the sidewall of the insulator member is inclined with respect to the surface acoustic wave traveling direction in the weighted portion of the reflector.

2. The surface acoustic wave device according to claim 1, further comprising a pad electrode located on the piezoelectric substrate and electrically connected to the IDT electrode;
a terminal electrode located on the top surface of the insulator member; and
an electrically conductive member electrically connecting the pad electrode to the terminal electrode.

3. The surface acoustic wave device according to claim 2, wherein the electrically conductive member is a through-type electrically conductive member penetrating the insulator member.

4. The surface acoustic wave device according to claim 1, wherein the surface acoustic wave device is a longitudinally coupled resonator-type surface acoustic wave filter comprising as the IDT electrodes at least three IDT electrodes arranged in the surface acoustic wave traveling direction.

5. The surface acoustic wave device according to claim 1, further comprising a single IDT electrode as the IDT electrode,
wherein the IDT electrode includes first and second bus bars,
a plurality of first electrode fingers extending from the inner side of the first bus bar toward the second bus bar, and a plurality of second electrode fingers extending from the inner side of the second bus bar toward the first bus bar, the IDT electrode being apodization weighted, an external side of at least one of the first and second bus bars has a portion inclined with respect to the surface acoustic wave traveling direction in accordance with apodization weighting, and the insulator member has the sidewall extending in parallel or substantially in parallel with the inclined external side.

6. The surface acoustic wave device according to claim 5, wherein the IDT electrode further comprises a first dummy electrode facing an end of a respective one of the plurality of first electrode fingers with a gap arranged therebetween, the first dummy electrode connected to the second bus bar, and a second dummy electrode facing an end of a respective one of the plurality of second electrode fingers with a gap arranged therebetween, the second dummy electrode connected to the first bus bar, wherein the IDT electrode is apodization weighted to include an apodization weighted portion, where an apodization decreases in the surface acoustic wave traveling direction away from a maximum apodization portion of electrode finger apodization in the IDT electrode, a side where one of the plurality of first electrode fingers of the first bus bar is connected to the second dummy electrode includes a portion inclined with respect to the surface acoustic wave traveling direction such that the side is spaced away by a constant separation from an envelope line of the apodization weighting, a side where one of the plurality of second electrode fingers of the second bus bar is connected to the first dummy electrode includes a portion inclined with respect to the surface acoustic wave traveling direction such that the side is spaced away by a constant separation from an envelope line of the apodization weighting, and in a portion where an outermost electrode finger of the IDT electrode is adjacent to the reflector, the length of an electrode finger of the reflector facing the outermost electrode finger of the IDT electrode is approximately equal to a sum of the length of the outermost electrode finger of the IDT electrode and the length of the dummy electrode facing the end of the outermost electrode finger of the IDT electrode.

7. A surface acoustic wave device comprising a ladder-type filter including a series arm resonator and a parallel arm resonator, each of the series arm resonator and the parallel arm resonator including a surface acoustic wave device of claim 6.

8. The surface acoustic wave device according to claim 1, wherein the insulator member is located on the piezoelectric substrate and comprises a support layer having an aperture through which a region of the IDT electrode and the reflector is exposed, and a cover laminated onto the support layer to close the aperture of the support layer.

9. A duplexer comprising a transmitter side filter including a ladder-type filter circuit, a receiver side filter including the surface acoustic wave device of claim 1, a wiring board including the transmitter side filter and the receiver side filter mounted thereon, and a mold resin layer encapsulating the transmitter side filter and the receiver side filter mounted on the wiring board.

* * * * *